United States Patent
Noda et al.

(10) Patent No.: US 12,205,830 B2
(45) Date of Patent: Jan. 21, 2025

(54) CLEANING APPARATUS FOR SEMICONDUCTOR WAFER AND METHOD OF CLEANING SEMICONDUCTOR WAFER

(71) Applicant: SUMCO CORPORATION, Tokyo (JP)

(72) Inventors: Kaito Noda, Saga (JP); Kazuhiro Ohkubo, Saga (JP); Yuki Nakao, Saga (JP); Michihiko Tomita, Nagasaki (JP)

(73) Assignee: SUMCO CORPORATION, Tokyo (JP)

( * ) Notice: Subject to any disclaimer, the term of this patent is extended or adjusted under 35 U.S.C. 154(b) by 146 days.

(21) Appl. No.: 17/791,769

(22) PCT Filed: Aug. 17, 2020

(86) PCT No.: PCT/JP2020/031026
§ 371 (c)(1),
(2) Date: Jul. 8, 2022

(87) PCT Pub. No.: WO2021/140697
PCT Pub. Date: Jul. 15, 2021

(65) Prior Publication Data
US 2023/0033913 A1    Feb. 2, 2023

(30) Foreign Application Priority Data

Jan. 10, 2020  (JP) ................ 2020-003047

(51) Int. Cl.
*H01L 21/67* (2006.01)
*H01L 21/687* (2006.01)

(52) U.S. Cl.
CPC .. *H01L 21/67051* (2013.01); *H01L 21/68764* (2013.01)

(58) Field of Classification Search
CPC ......... H01L 21/67051; H01L 21/68764; H01L 21/67028; H01L 21/304; H01L 21/6875;
(Continued)

(56) References Cited

U.S. PATENT DOCUMENTS

2002/0160691 A1* 10/2002 Ishikawa ................ B24B 49/04
                                                    451/8
2009/0320885 A1* 12/2009 Inoue ................ H01L 21/31138
                                                    134/104.2
(Continued)

FOREIGN PATENT DOCUMENTS

CN   209804606    12/2019
JP   H01-120980   8/1989
(Continued)

OTHER PUBLICATIONS

International Search Report issued in International Patent Appl. No. PCT/JP2020/031026, dated Nov. 2, 2020, along with an English translation thereof.

(Continued)

*Primary Examiner* — David G Cormier
*Assistant Examiner* — Thomas Bucci
(74) *Attorney, Agent, or Firm* — Greenblum & Bernstein, P.L.C.

(57) ABSTRACT

Provided is a cleaning apparatus and a cleaning method for semiconductor wafers that can hinder a mist of a cleaning solution from being adhered to a surface of a semiconductor wafer during cleaning of the semiconductor wafer. In a cleaning apparatus 1 for a semiconductor wafer, a spin cup 20 has an annular side wall portion 21; an inclined portion 22 that is inclined toward the rotating table 13; and an annular bent portion 23. The height position $h_{21}$ of the upper end portion 21c of the side wall portion 21 is set at a position lower than the height position $h_{14a}$ of the upper end portion 14a of the wafer retainer portion 14, and the inclination angle $\theta_{22}$ of the inclined portion to a horizontal plane and the width w of the inclined portion satisfy a formula (A):

$$\theta_{22}(°) \geq -0.65 \times w(\text{mm}) + 72.9° \qquad (A).$$

18 Claims, 4 Drawing Sheets

(58) Field of Classification Search
CPC ......... H01L 21/68785; H01L 21/02052; H01L 21/0209; H01L 21/68714
USPC ...................................................... 134/104.2
See application file for complete search history.

(56) References Cited

U.S. PATENT DOCUMENTS

| | | | | |
|---|---|---|---|---|
| 2010/0032097 | A1* | 2/2010 | Ohashi .............. | H01L 21/67034 156/345.55 |
| 2014/0116478 | A1* | 5/2014 | Higashijima ..... | H01L 21/67051 134/104.2 |
| 2014/0116480 | A1* | 5/2014 | Higashijima ..... | H01L 21/67051 134/153 |
| 2014/0137902 | A1* | 5/2014 | Aiura ................ | H01L 21/67051 134/104.2 |
| 2015/0380279 | A1* | 12/2015 | Kwon ............... | H01L 21/67051 134/104.2 |
| 2018/0025921 | A1* | 1/2018 | Kabune ................ | H01L 21/302 438/754 |

FOREIGN PATENT DOCUMENTS

| | | |
|---|---|---|
| JP | H09-148231 | 6/1997 |
| JP | 2010-10421 | 1/2010 |
| JP | 2014-86638 | 5/2014 |
| JP | 2014-86639 | 5/2014 |

OTHER PUBLICATIONS

Office Action issued in Corresponding JP Patent Appl. No. 2020-003047, dated Mar. 23, 2021, along with an English translation thereof.

Office Action issued in Corresponding Taiwanese Patent Appl. No. 109128375, dated Sep. 10, 2021, along with an English translation thereof.

International Preliminary Report on Patentability issued in International Patent Appl. No. PCT/JP2020/031026, dated Jul. 12, 2022, along with an English translation thereof.

* cited by examiner

CLEANING APPARATUS FOR SEMICONDUCTOR WAFER AND METHOD OF CLEANING SEMICONDUCTOR WAFER

TECHNICAL FIELD

This disclosure relates to a cleaning apparatus for a semiconductor wafer and a method of cleaning a semiconductor wafer.

BACKGROUND

Conventionally, silicon wafers are used as substrates for semiconductor devices. A silicon wafer can be obtained by performing a wafer processing process on a single crystal silicon ingot grown, for example, by the Czochralski (CZ) process or the like. In the wafer processing process, particles such as polishing powder are adhered to the surfaces of the silicon wafer. Accordingly, the particles are removed by performing cleaning on the silicon wafer after the wafer processing process.

Cleaning apparatuses for semiconductor wafers such as silicon wafers include batch processing cleaning apparatuses that simultaneously clean a plurality of wafers and single-wafer processing cleaning apparatuses that clean wafers one by one. Of them, single-wafer processing cleaning apparatuses have come to be mainly used in recent years, for example since the amount of a cleaning solution required is relatively small, cross contamination between wafers can be avoided, and simultaneous processing of a plurality of wafers has become more difficult due to increasing diameter of the wafers.

Of various types of single-wafer processing cleaning apparatuses, a so-called spin cleaning single-wafer processing cleaning apparatus for semiconductor wafers cleans the front and back surfaces of a semiconductor wafer by placing a semiconductor wafer to be cleaned on the upper surface of a rotating table provided on a wafer retaining portion, and while rotating the semiconductor wafer at a high rate, spraying cleaning solutions from cleaning solution supply nozzles to the front and back surfaces of the wafer.

Now, the cleaning solutions are scattered as a fine mist (hereinafter may simply be referred to as a "mist") outward in radial directions of the semiconductor wafer by centrifugal force, and the scattered mist is collected by providing a spin cup surrounding the wafer. For example, an apparatus disclosed in JP H01-120980 U (PTL 1) is configured so that a scattered cleaning solution hits the inner surface of a side wall portion of a spin cup.

CITATION LIST

Patent Literature

PTL 1: JP H01-120980 U

SUMMARY

Technical Problem

The present inventors cleaned a silicon wafer using a cleaning apparatus including a spin cup as disclosed in PTL 1, and found that part of the mist received by the spin cup was bounced and adhered to a surface of the silicon wafer.

When a mist is adhered to a surface of a silicon wafer, chemical reactions caused between the components of a cleaning solution contained in the mist and the mist is detected as light point defects (LPDs) in a subsequent examination step. Silicon wafers having many LPDs detected fail to pass, thus the yield is reduced. Accordingly, it is necessary to hinder the mist of the cleaning solution from being adhered to the surface of the silicon wafer during cleaning.

This disclosure has been made in view of the above problems. It could be helpful to provide a cleaning apparatus and a cleaning method for semiconductor wafers that can hinder a mist of a cleaning solution from being adhered to a surface of a semiconductor wafer during cleaning of the semiconductor wafer.

Solution to Problem

[1] A cleaning apparatus for a semiconductor wafer, comprising:
- a chamber having an opening in its lower part;
- a gas supply portion that is provided in an upper part of the chamber and supplies a gas downward;
- a rotating table inserted into the chamber from below the opening;
- a wafer retainer portion that is provided on an upper surface of the rotating table and retains the semiconductor wafer to be cleaned;
- an upper nozzle that supplies a cleaning solution toward an upper surface of the semiconductor wafer;
- a lower nozzle that supplies a cleaning solution toward a lower surface of the semiconductor wafer; and
- a spin cup that is provided around the rotating table and collects the cleaning solution scattered outward in radial directions of the rotating table, the spin cup comprising:
  - an annular side wall portion;
  - an annular inclined portion that has a lower end portion connected to an upper end portion of the side wall portion and is inclined toward the rotating table at an angle to the vertical direction; and
  - an annular bent portion having an upper end portion connected to an upper end portion of the inclined portion, wherein a height position of the upper end portion of the side wall portion is set at a position lower than a height position of an upper end portion of the wafer retainer portion, wherein an inclination angle $\theta_{22}$ of the inclined portion to a horizontal plane and a width w in a radial direction of the inclined portion satisfy a formula (A):

$$\theta_{22}(°) \geq -0.65 \times w(\text{mm}) + 72.9° \quad\quad (A).$$

[2] The cleaning apparatus for a wafer, according to [1] above, wherein the width w is 20 mm or more and 90 mm or less.

[3] The cleaning apparatus for a wafer, according to [1] or [2] above, wherein a difference h between a height position of a lower end portion of the bent portion and the height position of the upper end portion of the wafer retainer portion is 0 mm or more and 30 mm or less.

[4] The cleaning apparatus for a wafer, according to any one of [1] to [3] above, wherein the lower end portion of the bent portion is inclined toward the side wall portion.

[5] A method of cleaning a semiconductor wafer using the cleaning apparatus for a wafer, according to any one of claims 1 to 4, wherein a semiconductor wafer to be cleaned is placed on the wafer retainer portion; while a gas is supplied from the gas supply portion, a cleaning solution is sprayed on the upper surface of the semiconductor wafer from the upper nozzle, and a cleaning solution is sprayed on the lower surface of the semiconductor wafer from the lower nozzle; and meanwhile the rotating table is rotated to rotate the semiconductor wafer, thus front and back surfaces of the semiconductor wafer are cleaned while the gas is exhausted through a gap between the spin cup and the rotating table.

[6] The method of cleaning a semiconductor wafer, according to [5] above, wherein the cleaning of the semiconductor wafer is performed under conditions where a flow rate F of the gas supplied from the gas supply portion and a rotation rate R of the rotating table satisfy a formula (B):

$$F(m^3/min) \geq 6.9 \times 10^{-3} \times R(rpm) \quad \text{(B)}.$$

[7] The method of cleaning a semiconductor wafer, according to [5] or [6] above, wherein the semiconductor wafer to be cleaned is a silicon wafer.

Advantageous Effect

This disclosure can hinder a mist of a cleaning solution from being adhered to a surface of a semiconductor wafer while cleaning the semiconductor wafer.

DETAILED DESCRIPTION

Cleaning Apparatus for Semiconductor Wafer

Figure 1:
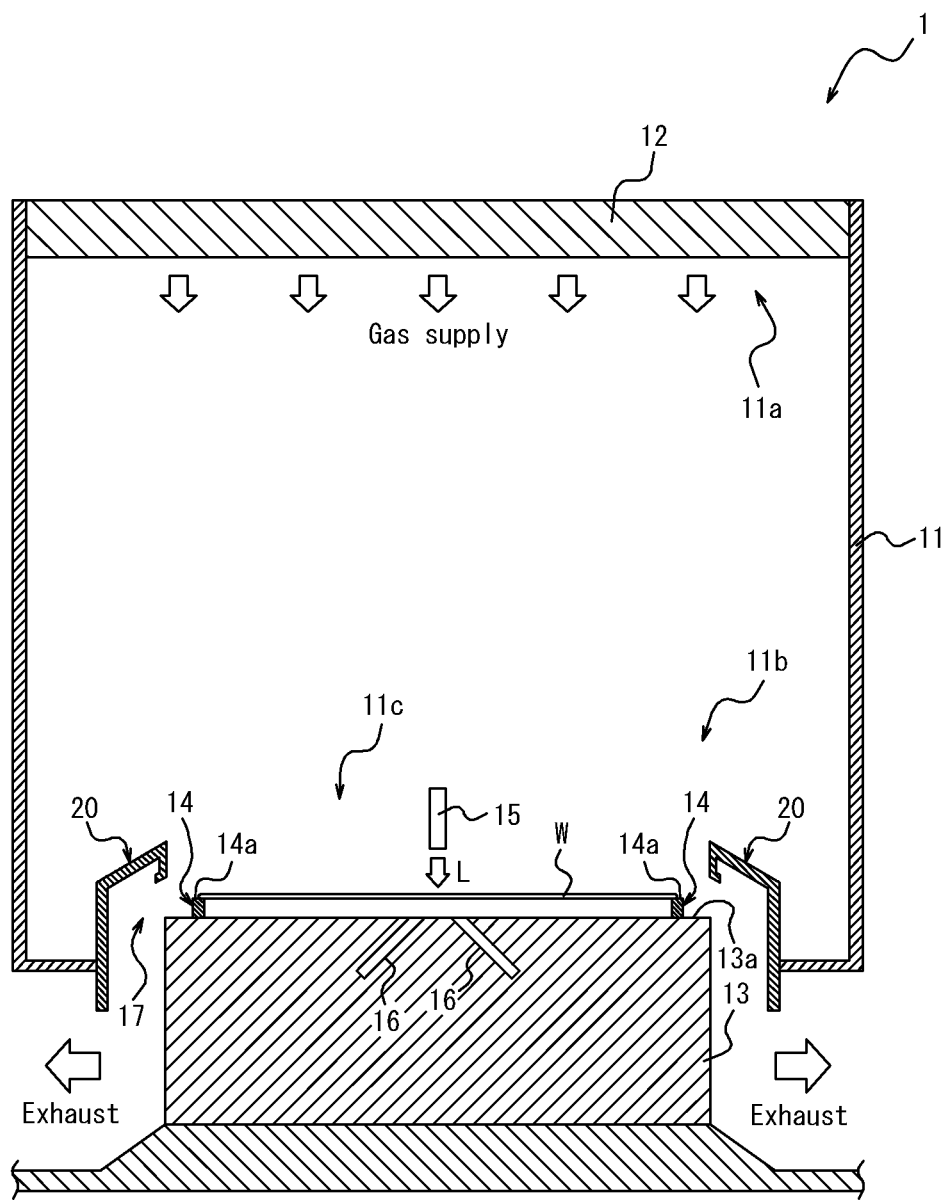
FIG. 1 is a diagram illustrating an example of a cleaning apparatus for a wafer, according to this disclosure.

Embodiments of this disclosure will now be described with reference to the drawings. FIG. 1 illustrates an example of a cleaning apparatus for a wafer, according to this disclosure. A cleaning apparatus 1 depicted in FIG. 1 includes: a chamber 11 having an opening 11c in its lower part 11b; a gas supply portion 12 that is provided in an upper part 11a of the chamber 11 and supplies a gas downward; a rotating table 13 that has a generally circular cylindrical shape and is inserted into the chamber 11 from below the opening 11c; a wafer retainer portion 14 that is provided on an upper surface 13a of the rotating table 13 and retains the semiconductor wafer to be cleaned W; an upper nozzle 15 that supplies a cleaning solution L toward an upper surface of the semiconductor wafer W; a lower nozzle 16 that supplies a cleaning solution L toward a lower surface of the semiconductor wafer W; and a spin cup 20 that is provided around the rotating table 13 and collects the cleaning solution L scattered outward in radial directions of the rotating table 13.

With a view to solving the above problems, the present inventors studied the shape of the spin cup 20. In the study, the spin cup 20 having a structure depicted in FIG. 2 was contemplated. Specifically, the spin cup 20 depicted in FIG. 2 has an annular side wall portion 21; an annular inclined portion 22 that has a lower end portion 22d connected to an upper end portion 21c of the side wall portion 21 and is inclined toward the rotating table 13 at an angle to the vertical direction; and an annular bent portion 23 having an upper end portion 23c connected to an upper end portion 22c of the inclined portion 22.

The above spin cup 20 is configured to be lowered so that the height position of an upper end portion 20a of the spin cup 20 is lower than the height position of an upper end portion 14a of the wafer retainer portion 14 when the semiconductor wafer W is transferred, for example when the semiconductor wafer W is placed on the wafer retainer portion 14 or when the semiconductor wafer W placed on the wafer retainer portion 14 is removed. Accordingly, a gap of approximately 2 mm to 3 mm in the horizontal direction is provided between the above rotating table 13 and the bent portion 23 of the spin cup 20, and is adapted so that they do not hit each other when the spin cup 20 is lowered.

The distance between an inner surface 23a of the bent portion 23 of the spin cup 20 and the wafer retainer portion 14 in the horizontal direction is 25 mm to 27 mm, preferably 25.5 mm to 26.5 mm.

An exhaust path 17 is formed between the spin cup 20 and the rotating table 13, gases such as air supplied from the gas supply portion 12 and a mist of the cleaning solution L scattered from the semiconductor wafer W placed and rotated on the upper end portion 14a of the wafer retainer portion 14 is exhausted from a discharge port (not shown) through the exhaust path 17.

Figure 3:
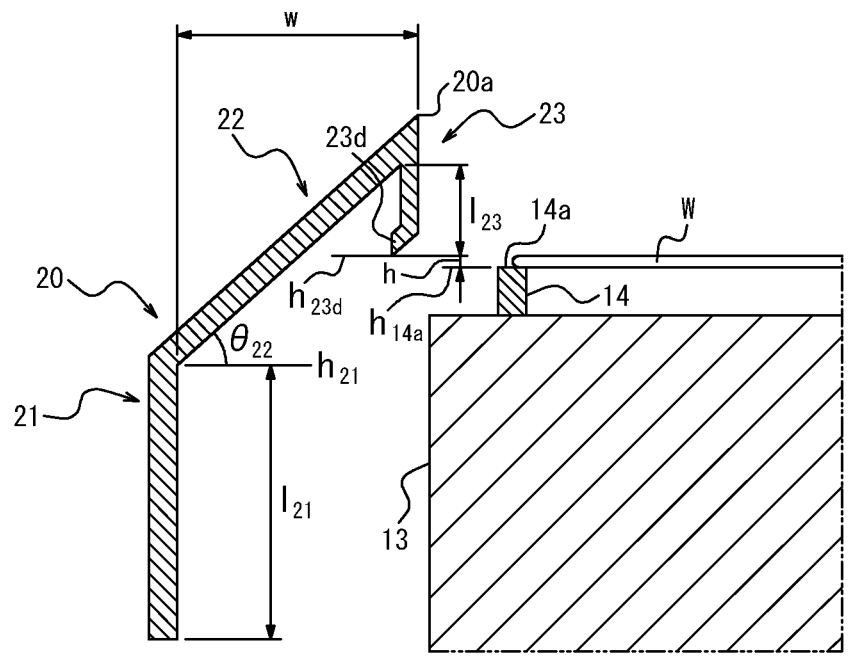
FIG. 3 is a diagram illustrating parameters of a spin cup that are changed.

The present inventors investigated in detail, by fluid simulation as illustrated in FIG. 3, the behavior of the flow of gases through the exhaust path 17 (gas flow) in cases where parameters of the spin cup 20, specifically, the length $l_{21}$ of the side wall portion 21 in the vertical direction, the height position $h_{21}$ of the upper end portion 21c of the side wall portion 21, the inclination angle $\theta_{22}$ of the inclined portion 22 to a horizontal plane, the width w of the inclined portion 22 in the radial direction (that is, the distance between an inner surface 21a of the side wall portion 21 and the inner surface 23a of the bent portion 23, hereinafter may also be simply referred to as "width"), the length $l_{23}$ of the bent portion 23 in the vertical direction are variously changed.

Figure 4:
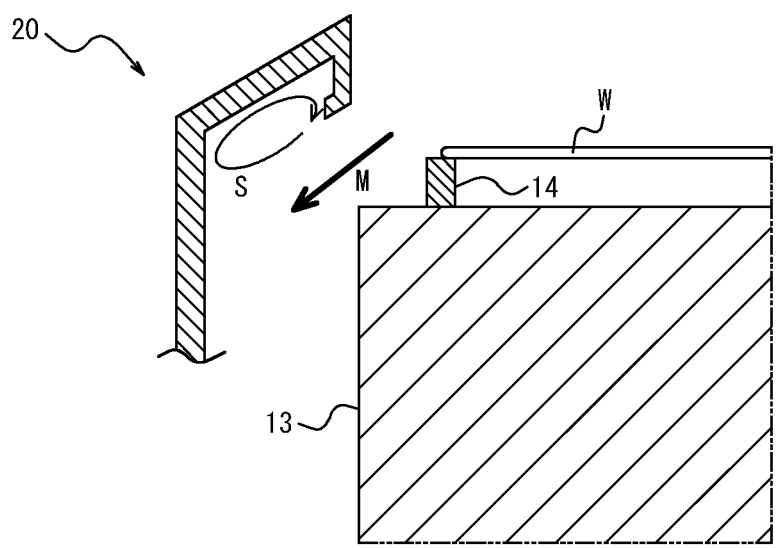
FIG. 4 is a schematic view illustrating an example of a gas flow through an exhaust path.

FIG. 4 presents a schematic view of an example of a gas flow through an exhaust path 17, determined by fluid simulation. As illustrated in FIG. 4, the gas flow through the exhaust path 17 was found to generally include a main flow M flowing downward and a swirling flow S that is formed in a region defined by the inner surface 21a of the side wall portion 21, the inner surface 22a of the inclined portion 22, and the outer surface 23b of the bent portion 23 and moves upward along the inner surface 21a of the side wall portion 21 and the inner surface 22a of the inclined portion 22.

In the course of investigating the behavior of the gas flow by variously changing the parameters of the spin cup 20 depicted in FIG. 3, the present inventors considered that the following two requirements need to be met in order that the mist scattered from the semiconductor wafer W may be favorably exhausted from the exhaust path 17 and hindered from being adhered to the surface of the semiconductor wafer W.

(a) The height position $h_{21}$ of the upper end portion 21c of the side wall portion 21 (that is, the height position of the line of intersection of the inner surface 21a of the side wall portion 21 and the inner surface 22a of the inclined portion 22) is set at a position as high as or lower than the height position $h_{14a}$ of the upper end portion 14a of the wafer retainer portion 14 (b) The inclination angle $\theta_{22}$ of the inclined portion 22 to a horizontal plane is at an angle equal to or larger than the direction of the main flow M in the exhaust path 17, that is, the inclination angle θM of the main flow M to a horizontal plane.

Regarding the requirement (a) above, as with the spin cup disclosed in PTL 1, when the height position $h_{21}$ of the upper end portion 21c of the above side wall portion 21 is set at a position higher than the height position $h_{14a}$ of the upper end portion 14a of the wafer retainer portion 14, the mist scattered from the semiconductor wafer W side would hit the inner surface 21a of the side wall portion 21 parallel to the vertical direction and would bounce toward the semiconductor wafer W and adhere to the semiconductor wafer W.

On the other hand, when the height position $h_{21}$ of the upper end portion 21c of the side wall portion 21 is set at a position as high as or lower than the height position $h_{14a}$ of the upper end portion 14a of the wafer retainer portion 14, the mist scattered from the semiconductor wafer W side would hit the inner surface 22a of the inclined portion 22 and would bounce downward, thus the mist would not likely be adhered to the surface of the semiconductor wafer W.

Further, regarding the requirement (b), the above fluid simulation demonstrated that when the inclination angle $\theta_{22}$ of the inclined portion 22 is smaller than the inclination angle $\theta_M$ of the main flow M, the swirling flow S swells and grows larger downward. On the other hand, when the inclination angle $\theta_{22}$ of the inclined portion 22 is equal to or larger than the inclination angle $\theta_M$ of the main flow M, it was found that the swirling flow S comes to have a thin shape along the inner surface 22a of the inclined portion 22, and the mist exhausted from the exhaust path 17 rides on the swirling flow and hardly returns to the semiconductor wafer W, thus the mist is favorably exhausted along the flow of the main flow M.

However, for the requirement (b) above, the parameters of the spin cup 20 on which the direction of the main flow M depend were not certain; accordingly, fluid simulations were performed while variously changing the parameters of the spin cup 20. As a result, it was found that the direction of the main flow M, that is the inclination angle $\theta_M$ of the main flow M to a horizontal plane does not depend on the length $l_{21}$ of the side wall portion 21 in the vertical direction, the inclination angle $\theta_{22}$ of the inclined portion 22, but the length $l_{23}$ of the bent portion 23 in the vertical direction, and greatly depends on the width w of the inclined portion 22.

The present inventors studied requirements that the inclination angle $\theta_{22}$ of the inclined portion 22 to a horizontal plane should meet based on the requirement (b) from the relationship between the width w of the inclined portion 22 and the inclination angle $\theta_M$ of the main flow to a horizontal plane. As a result, they found that the mist scattered outward in radial directions of the rotating table 13 can be hindered from returning to the semiconductor wafer W and being adhered to the surface of the semiconductor wafer W when the width w of the inclined portion 22 and the angle $\theta_{22}$ of the inclined portion 22 to a horizontal plane satisfy a formula (A):

$$\theta_{22}(°) \geq -0.65 \times w(\text{mm}) + 72.9° \tag{A}$$

The above formula (A) indicates that in designing the spin cup 20 that hinders the mist from returning to and being adhered to the semiconductor wafer W, separately adjusting the inclination angle $\theta_{22}$ of the inclined portion 22 and the width w of the inclined portion 22 is not sufficient and it is important to optimize the relationship between the inclination angle $\theta_{22}$ of the inclined portion 22 and the width w of the inclined portion 22.

Thus, the cleaning apparatus 1 for a semiconductor wafer, according to this disclosure is characterized by the structure of the spin cup 20, and the other components are not limited. Examples of components other than the spin cup 20 will now be described.

The chamber 11 is a container that houses the semiconductor wafer to be cleaned W placed on the wafer retainer portion 14 during cleaning and drying. The shape of this chamber 11 may be, for example, a generally rectangular parallelepiped shape as illustrated in FIG. 1.

The gas supply portion 12 is provided in an upper part 11a of the chamber 11, and supplies gases such as air downward in the chamber 11 from the outside of the chamber 11 during cleaning and drying. On the other hand, the opening 11c is provided in the lower part 11b of the chamber 11. The shape of the opening 11c may be, for example, a circular shape.

The rotating table 13 is a table that rotates the semiconductor wafer W during cleaning and drying, and is configured to be rotated at a predetermined rotation rate (for example, 100 rpm to 2000 rpm) by a rotating mechanism (not shown) provided below the rotating table.

The upper surface 13a of the rotating table 13 is provided with the wafer retainer portion 14 that retains the semiconductor wafer W. The wafer retainer portion 14 can be constituted by for example a plurality of (for example, three) chuck pins and can support the semiconductor wafer W by point contact.

On the other hand, the upper nozzle 15 that sprays the cleaning solution L to a surface (front surface) of the semiconductor wafer W is provided above the rotating table 13. The upper nozzle 15 is constituted by nozzles each for a different a different chemical solution; for example, when four chemical solutions are sprayed, the upper nozzle 15 may be constituted by four nozzles disposed at regular intervals.

Further, the lower nozzle 16 that sprays the cleaning solution L to the back surface of the semiconductor wafer W is retained in the rotating table 13, and is situated to spray the cleaning solution L to a center part of the back surface of the semiconductor wafer W. As with the upper nozzle 15, the lower nozzle 16 is constituted by nozzles each for a different chemical solution; for example, when four chemical solutions are sprayed, the lower nozzle 16 may be constituted by four nozzles disposed at regular intervals Note that even when the rotating table 13 is rotated, the lower nozzle 16 is constituted not to be rotated. Further, another nozzle that sprays a gas other than the cleaning solution to the semiconductor wafer W may be provided.

In such a cleaning apparatus 1, the semiconductor wafer to be cleaned W is placed on the wafer retainer portion 14; while a gas is supplied from the gas supply portion 12 and the cleaning solution L is sprayed from the upper nozzle 15 and the lower nozzle 16, the rotating table 13 is rotated at a predetermined rotation rate to rotate the semiconductor wafer W, and the front and back surfaces of the semiconductor wafer W are cleaned while the gas is exhausted through the exhaust path 17 between the spin cup 20 and the rotating table 13, thus the mist of the cleaning solution can be hindered from being adhered to the semiconductor wafer W during cleaning.

The width w of the inclined portion 22 is preferably 20 mm or more and 90 mm or less. When the width w of the inclined portion 22 is 20 mm or more, the mist is hindered from riding on the swirling flow S and hindered from returning toward the semiconductor wafer W. On the other hand, when the width w of the inclined portion 22 is larger, the mist having hit the inner wall 22a of the inclined portion 22 returns toward the semiconductor wafer W more easily, yet a width w of 90 mm or less can sufficiently hinder the mist having hit the inner wall 22a of the inclined portion 22 from returning toward the semiconductor wafer W.

The difference h between the height position of the lower end portion 23d of the bent portion 23 and the height position $h_{14a}$ of the upper end portion 14a of the wafer retainer portion 14 is preferably 0 mm or more and 30 mm or less. When the above difference h is 0 mm or more, the mist of the cleaning solution L scattered from the circumference of the semiconductor wafer W can be made to hit the inner surface 22a of the inclined portion 22. On the other hand, when h is 30 mm or less, the gap between the bent portion 23 and the rotating table 13 is narrow, thus the flow rate of the gas flow through the gap can be increased, and the movement of the mist returning to the semiconductor wafer W can be hindered.

Further, the lower end portion 23d of the bent portion 23 is preferably inclined toward the side wall portion 21. Where the movement of the mist included in the swirling flow S that returns to the semiconductor wafer W can be hindered by the bent portion 23, the above movement can be further hindered by inclining the lower end portion 23d of the bent portion 23 toward the side wall portion 21.

(Method of Cleaning Semiconductor Wafer)

In a method of cleaning a semiconductor wafer, according to this disclosure, using the above-described cleaning apparatus for a wafer, according to this disclosure, the semiconductor wafer to be cleaned W is placed on the wafer retainer portion 14; while a gas is supplied from the gas supply portion 12 and a cleaning solution L is sprayed from the upper nozzle 15 and the lower nozzle 16, the rotating table 13 is rotated to rotate the semiconductor wafer W, and the front and back surfaces of the semiconductor wafer W are cleaned while the gas is exhausted through the exhaust path between the spin cup 20 and the rotating table 13.

Cleaning of the semiconductor wafer is preferably performed under conditions where the flow rate F of the gas supplied from the gas supply portion 12 and the rotation rate R of the rotating table 13 satisfy a formula (B):

$$F(m^3/min) \geq 6.9 \times 10^{-3} \times R(rpm) \quad (B)$$

A study made by the present inventors demonstrated that when the rotation rate R of the rotating table 13 (or the semiconductor wafer W) is high, the swirling flow S grows significantly, and the mist returning toward the semiconductor wafer W tends to increases as compared with the case of a low rotation rate R. However, from a further study made by the present inventors, when the flow rate F of the gas and the rotation rate R of the rotating table 13 satisfy the above formula (B), the swirling flow S can be hindered from growing significantly and the mist returning toward the semiconductor wafer W can be hindered from increasing.

The above-described cleaning method according to this disclosure can favorably clean a semiconductor wafer made of a IV semiconductor or a III-V semiconductor, and can favorably clean the front and back surfaces of a silicon wafer in particular.

EXAMPLES

Examples will now be described in detail; however, this disclosure is not limited to Examples below.

Example

A silicon wafer was cleaned using the cleaning apparatus 1 for a semiconductor wafer, according to this disclosure, illustrated in FIG. 1. Now, the structure spin cup 20 was such that, referring to FIG. 2, the width of the inclined portion 22 was 60 mm, the distance from the lower end portion 23d of the bent portion 23 to the upper end portion 14a of the wafer retainer portion 14 was 15 mm, and the inclination angle $\theta_{22}$ of the inclined portion 22 was 40°. Further, the height position $h_{21}$ of the side wall portion 21 (upper end portion 21c) was at a position lower than the upper end portion 14a of the wafer retainer portion 14.

Comparative Example

Figure 2:
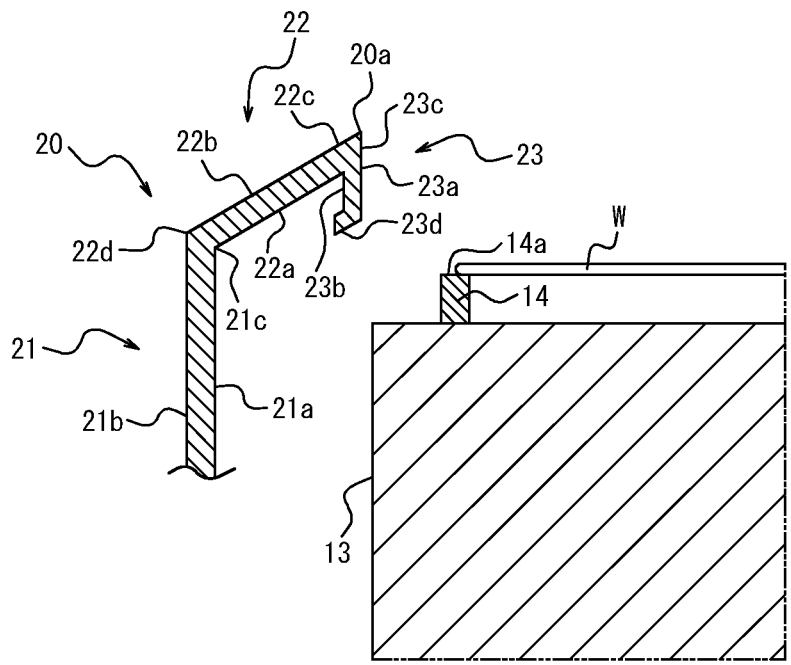
FIG. 2 is a diagram illustrating the structure of a spin cup contemplated in this disclosure.

A silicon wafer was cleaned in the same manner as in Example, except that in the structure of the spin cup, referring to FIG. 2, the inclination angle $\theta_{22}$ of the inclined portion 22 was 20°. All the other conditions were the same as those in Example.

Figure 5:
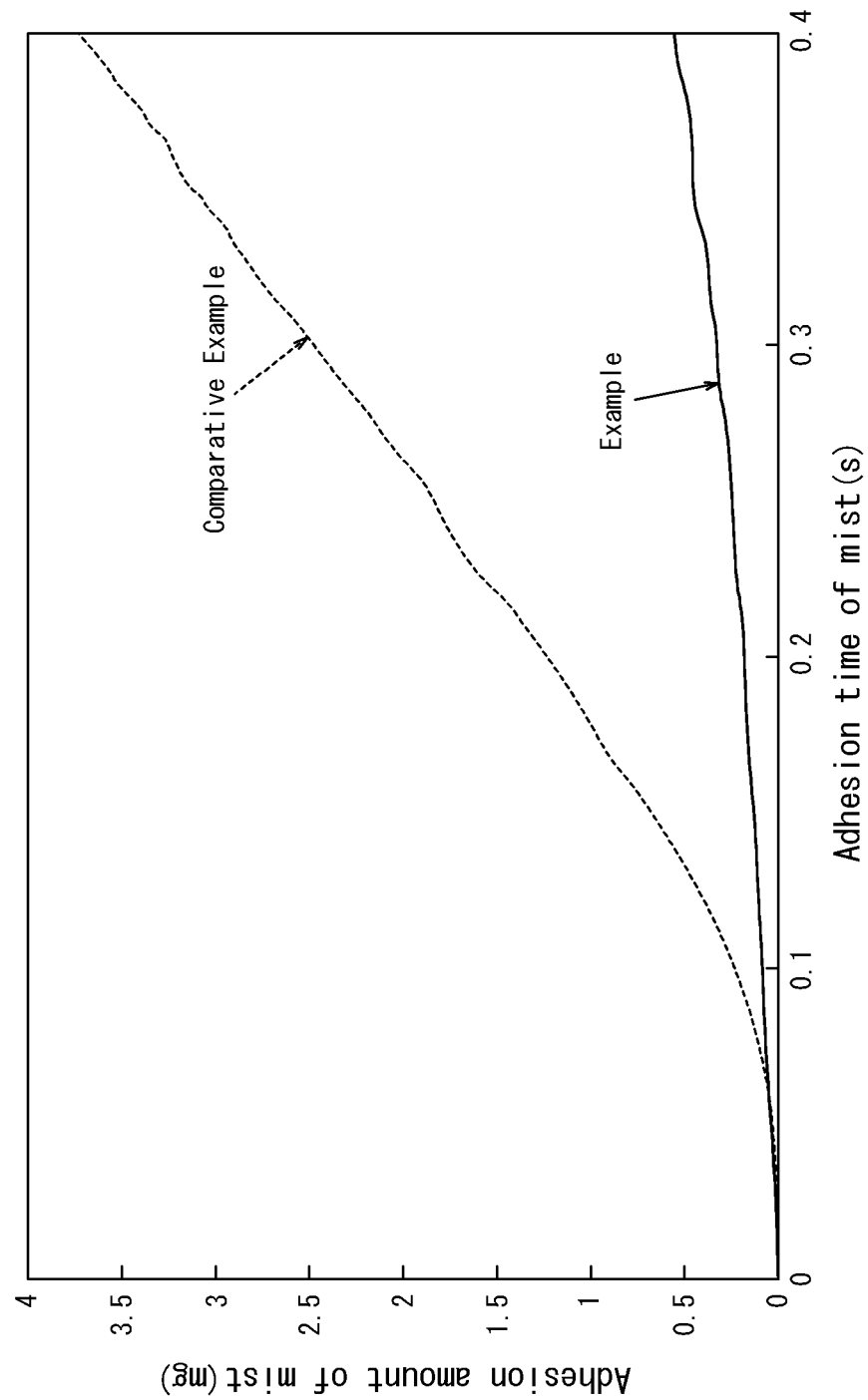
FIG. 5 is a diagram illustrating the relationship between the adhesion time and the adhesion amount of a mist of a cleaning solution in Example and Conventional Example.

FIG. 5 presents the relationship between the adhesion time and the adhesion amount of a mist of a cleaning solution adhered to the silicon wafer during cleaning. The relationship in FIG. 5 was obtained by simulation taking into account the behaviors of gas flows and the cleaning solution. In FIG. 5, the "adhesion time of mist" on the horizontal axis is the time elapsed after the start of adhesion of the mist on the surface of the silicon wafer, and corresponds to the cleaning time in the case of cleaning an actual silicon wafer. Further, the "adhesion amount of mist" on the vertical axis is the sum (total) of the mass of the mist adhered to the silicon wafer. FIG. 5 demonstrates that the adhesion amount of the mist in Example is significantly smaller than that in Comparative Example.

INDUSTRIAL APPLICABILITY

This disclosure is helpful in the semiconductor wafer manufacturing industry, since a mist of a cleaning solution can be hindered from being adhered to a surface of a semiconductor wafer while cleaning the semiconductor wafer.

REFERENCE SIGNS LIST

1: Cleaning apparatus
10: Chamber
11a: Upper part of chamber
11b: Lower part of chamber
11c: Opening
12: Gas supply portion
13: Rotating table
14: Wafer retainer portion
15: Upper nozzle
16: Lower nozzle
17: Exhaust path
20: Spin cup
20a: Upper end portion of spin cup
21: Side wall portion
21a, 22a, 23a: Inner surface
21b, 22b, 23b: Outer surface
21c, 22c, 23c: Upper end portion
22d, 23d: Lower end portion
22: Inclined portion
23: Bent portion
M: Main flow
S: Swirling flow
W: Semiconductor wafer

The invention claimed is:

1. A cleaning apparatus for a semiconductor wafer, comprising:
   a chamber having an opening in its lower part;
   a gas supply portion that is provided in an upper part of the chamber and supplies a gas downward;
   a rotating table inserted into the chamber from below the opening;
   a wafer retainer portion that is provided on an upper surface of the rotating table and retains the semiconductor wafer to be cleaned;
   an upper nozzle that supplies a cleaning solution toward an upper surface of the semiconductor wafer;
   a lower nozzle that supplies a cleaning solution toward a lower surface of the semiconductor wafer; and
   a spin cup that is provided around the rotating table and collects the cleaning solution scattered outward in radial directions of the rotating table, the spin cup comprising:
      an annular side wall portion;
      an annular inclined portion that has a lower end portion connected to an upper end portion of the side wall portion and is inclined toward the rotating table at an angle to the vertical direction; and
      an annular bent portion having an upper end portion connected to an upper end portion of the inclined portion,
   wherein a height position of the upper end portion of the side wall portion is set at a position lower than a height position of an upper end portion of the wafer retainer portion,
   wherein an inclination angle $\theta_{22}$ of the inclined portion to a horizontal plane and a width w in a radial direction of the inclined portion satisfy a formula (A):

$$\theta_{22}(°) \geq -0.65 \times w(\text{mm}) + 72.9° \tag{A}.$$

2. The cleaning apparatus for a wafer, according to claim 1, wherein the width w is 20 mm or more and 90 mm or less.

3. The cleaning apparatus for a wafer, according to claim 1, wherein a difference h between a height position of a lower end portion of the bent portion and the height position of the upper end portion of the wafer retainer portion is 0 mm or more and 30 mm or less.

4. The cleaning apparatus for a wafer, according to claim 1, wherein a lower end portion of the bent portion is inclined toward the side wall portion.

5. A method of cleaning a semiconductor wafer using the cleaning apparatus for a wafer, according to claim 1, wherein a semiconductor wafer to be cleaned is placed on the wafer retainer portion; while a gas is supplied from the gas supply portion, a cleaning solution is sprayed on the upper surface of the semiconductor wafer from the upper nozzle, and a cleaning solution is sprayed on the lower surface of the semiconductor wafer from the lower nozzle; and meanwhile the rotating table is rotated to rotate the semiconductor wafer, thus front and back surfaces of the semiconductor wafer are cleaned while the gas is exhausted through a gap between the spin cup and the rotating table.

6. The method of cleaning a semiconductor wafer, according to claim 5, wherein the cleaning of the semiconductor wafer is performed under conditions where a flow rate F of the gas supplied from the gas supply portion and a rotation rate R of the rotating table satisfy a formula (B):

$$F(\text{m}^3/\text{min}) \geq 6.9 \times 10^{-3} \times R(\text{rpm}) \tag{B}.$$

7. The method of cleaning a semiconductor wafer, according to claim 5, wherein the semiconductor wafer to be cleaned is a silicon wafer.

8. The cleaning apparatus for a wafer, according to claim 2, wherein a difference h between a height position of a lower end portion of the bent portion and the height position of the upper end portion of the wafer retainer portion is 0 mm or more and 30 mm or less.

9. The cleaning apparatus for a wafer, according to claim 2, wherein a lower end portion of the bent portion is inclined toward the side wall portion.

10. The cleaning apparatus for a wafer, according to claim 3, wherein the lower end portion of the bent portion is inclined toward the side wall portion.

11. The cleaning apparatus for a wafer, according to claim 8, wherein the lower end portion of the bent portion is inclined toward the side wall portion.

12. A method of cleaning a semiconductor wafer using the cleaning apparatus for a wafer, according to claim 2, wherein a semiconductor wafer to be cleaned is placed on the wafer retainer portion; while a gas is supplied from the gas supply portion, a cleaning solution is sprayed on the upper surface of the semiconductor wafer from the upper nozzle, and a cleaning solution is sprayed on the lower surface of the semiconductor wafer from the lower nozzle; and meanwhile the rotating table is rotated to rotate the semiconductor wafer, thus front and back surfaces of the semiconductor wafer are cleaned while the gas is exhausted through a gap between the spin cup and the rotating table.

13. A method of cleaning a semiconductor wafer using the cleaning apparatus for a wafer, according to claim 3, wherein a semiconductor wafer to be cleaned is placed on the wafer retainer portion; while a gas is supplied from the gas supply portion, a cleaning solution is sprayed on the upper surface of the semiconductor wafer from the upper nozzle, and a cleaning solution is sprayed on the lower surface of the semiconductor wafer from the lower nozzle; and meanwhile the rotating table is rotated to rotate the semiconductor wafer, thus front and back surfaces of the semiconductor wafer are cleaned while the gas is exhausted through a gap between the spin cup and the rotating table.

14. A method of cleaning a semiconductor wafer using the cleaning apparatus for a wafer, according to claim 4, wherein a semiconductor wafer to be cleaned is placed on the wafer retainer portion; while a gas is supplied from the gas supply portion, a cleaning solution is sprayed on the upper surface of the semiconductor wafer from the upper nozzle, and a cleaning solution is sprayed on the lower surface of the semiconductor wafer from the lower nozzle; and meanwhile the rotating table is rotated to rotate the semiconductor wafer, thus front and back surfaces of the semiconductor wafer are cleaned while the gas is exhausted through a gap between the spin cup and the rotating table.

15. A method of cleaning a semiconductor wafer using the cleaning apparatus for a wafer, according to claim 8, wherein a semiconductor wafer to be cleaned is placed on the wafer retainer portion; while a gas is supplied from the gas supply portion, a cleaning solution is sprayed on the upper surface of the semiconductor wafer from the upper nozzle, and a cleaning solution is sprayed on the lower surface of the semiconductor wafer from the lower nozzle; and meanwhile the rotating table is rotated to rotate the semiconductor wafer, thus front and back surfaces of the semiconductor wafer are cleaned while the gas is exhausted through a gap between the spin cup and the rotating table.

16. A method of cleaning a semiconductor wafer using the cleaning apparatus for a wafer, according to claim 9, wherein a semiconductor wafer to be cleaned is placed on the wafer retainer portion; while a gas is supplied from the gas supply portion, a cleaning solution is sprayed on the upper surface of the semiconductor wafer from the upper nozzle, and a cleaning solution is sprayed on the lower surface of the semiconductor wafer from the lower nozzle; and meanwhile the rotating table is rotated to rotate the semiconductor wafer, thus front and back surfaces of the semiconductor wafer are cleaned while the gas is exhausted through a gap between the spin cup and the rotating table.

17. A method of cleaning a semiconductor wafer using the cleaning apparatus for a wafer, according to claim 10, wherein a semiconductor wafer to be cleaned is placed on the wafer retainer portion; while a gas is supplied from the gas supply portion, a cleaning solution is sprayed on the upper surface of the semiconductor wafer from the upper nozzle, and a cleaning solution is sprayed on the lower surface of the semiconductor wafer from the lower nozzle; and meanwhile the rotating table is rotated to rotate the semiconductor wafer, thus front and back surfaces of the semiconductor wafer are cleaned while the gas is exhausted through a gap between the spin cup and the rotating table.

18. A method of cleaning a semiconductor wafer using the cleaning apparatus for a wafer, according to claim 11, wherein a semiconductor wafer to be cleaned is placed on the wafer retainer portion; while a gas is supplied from the gas supply portion, a cleaning solution is sprayed on the upper surface of the semiconductor wafer from the upper nozzle, and a cleaning solution is sprayed on the lower surface of the semiconductor wafer from the lower nozzle; and meanwhile the rotating table is rotated to rotate the semiconductor wafer, thus front and back surfaces of the semiconductor wafer are cleaned while the gas is exhausted through a gap between the spin cup and the rotating table.

* * * * *

UNITED STATES PATENT AND TRADEMARK OFFICE
CERTIFICATE OF CORRECTION

PATENT NO. : 12,205,830 B2
APPLICATION NO. : 17/791769
DATED : January 21, 2025
INVENTOR(S) : K. Noda et al.

Page 1 of 1

It is certified that error appears in the above-identified patent and that said Letters Patent is hereby corrected as shown below:

In the Claims

Column 9, Line 38 (Formula A) (Claim 1, Line 34) please change "$\leftarrow_{22}$" to -- $\theta_{22}$ --

Signed and Sealed this
Seventeenth Day of June, 2025

Coke Morgan Stewart
*Acting Director of the United States Patent and Trademark Office*